United States Patent [19]

Berkel

[11] Patent Number: 4,929,907
[45] Date of Patent: May 29, 1990

[54] OUTPUT AMPLIFIER

[75] Inventor: Werner Berkel, Weil der Stadt, Fed. Rep. of Germany

[73] Assignee: Hewlett-Packard Company, Palo Alto, Calif.

[21] Appl. No.: 320,672

[22] Filed: Mar. 8, 1989

[30] Foreign Application Priority Data

Mar. 9, 1988 [EP] European Pat. Off. ......... 88103693.3

[51] Int. Cl.$^5$ .............................................. H03F 3/45
[52] U.S. Cl. .................................... 330/252; 330/261; 330/300
[58] Field of Search ............... 307/355, 494, 497, 570; 330/149, 252, 261, 277, 300, 310, 311

[56] References Cited

U.S. PATENT DOCUMENTS

| | | | |
|---|---|---|---|
| 4,121,169 | 10/1978 | Iwanatsu | 330/261 X |
| 4,464,636 | 8/1984 | Dobrovolny | 330/300 |
| 4,528,520 | 7/1985 | Osawa | 330/300 |
| 4,528,520 | 5/1985 | Jett, Jr. et al. | 330/311 X |

FOREIGN PATENT DOCUMENTS

2104747 3/1983 United Kingdom .

OTHER PUBLICATIONS

IEEE Transactions on Electron Devices, vol. ED-25, No. 6, Jun. 1987, pp. 563–567, T. Furutsuka et al, Improvement of the Drain Breakdown Voltage of GaAs Power MESFETS by a Simple Recess Structure.

Primary Examiner—Steven Mottola

[57] ABSTRACT

An output amplifier for pulse generators comprises a first differential bipolar transistor amplifier stage for amplifying complementary voltage pulses and a second gallium arsenide field-effect (GaAs FET) transistor stage with two GaAs FET transistors wired as a common gate stage having a constant voltage bias. The GaAs FET transistor amplifier stage, responsive to the first amplifier stage, is used to generate high output voltage swings having fast transition times over a wide frequency band, whereas the bipolar transistor amplifier stage provides high gain and compensation of the GaAs anomalies.

6 Claims, 2 Drawing Sheets

OUTPUT AMPLIFIER

BACKGROUND OF THE INVENTION

1. Field of the Invention

This invention relates to an output amplifier providing a high output voltage swing for fast pulse amplification in pulse generators, comprising a first bipolar transistor linear amplifier stage receiving an internal pulse signal and a second amplifier stage which is directly (or indirectly) controlled by the output of said first amplifier stage and comprises at least one field-effect transistor.

2. Description of the Prior Art

It is a major problem in pulse generator technology to provide pulses with very fast (variable) rise and/or fall times (fast transition times). The limiting factor in most applications is the output amplifier which receives a pulse signal internally generated (internal pulse signal).

Bipolar technology is used in output amplifiers of the type described above. In such a bipolar output amplifier, a first bipolar transistor stage may receive the pulse signal internally generated. This first stage may be a differential amplifier, the outputs of said differential stage being connected to a second bipolar transistor amplifier stage. The second stage comprises bipolar transistors which are able to generate an output signal with the required output voltage swing, i.e. the necessary maximum/minimum output signal amplitude.

Usually, pulse generators have to provide an output swing of 10 v (volts). For medium output bandwidths (medium transition times of the generated output pulses), bipolar transistors are suitable.

Unfortunately, this does not apply for very fast transition times, e.g. transition times of 0.6 ns (nanoseconds) and below. Upon such fast transition times which correspond to a bandwidth of 1.0 GHz (Gigahertz), the collector-emitter breakdown voltage is in the range of 6 V and therefore not applicable for output swings of 10 V. This is one of the reasons that pulse generators with adjustable amplitudes, rise times and offsets were not yet designed to generate the very fast transition time mentioned above.

Output amplifiers based on other technologies than bipolar technology are unsuited for the application described above. For example, an output amplifier on the exclusive basis of gallium arsenide field effect transistors suffers from a very small gain. This small gain does not allow feedback loops to compensate the amplifier for temperature effects and for linearization. A further disadvantage is the so-called "droop effect", i.e. the high frequency gain is different from the low frequency gain (one should keep in mind that commercial pulse generators allow adjustment of the pulse repetition rate, i.e. the output amplifier has to be a broadband amplifier, from direct current to the maximum frequency).

It is also already known to replace the bipolar transistor in the second amplifier stage by a power MOSFET transistor, cf. U.S. Pat. No. 4,528,520 which depicts an output amplifier for a cathode ray tube. The MOSFET provides higher output swing without deteriorating the high frequency characteristic.

SUMMARY OF THE INVENTION

It is a major objective of the present invention to provide an output amplifier of the type described above with even improved characteristics and which is particularly suited for pulse generators. Specifically, the output amplifier should provide a swing of 15 V and transition times of 0.6 ns.

According to the invention, this problems is solved in that said first bipolar transistor linear amplifier stage comprises a differential amplifier with differential inputs and outputs, that said second amplifier stage comprises two gallium arsenide field-effect transistors, each of these transistors being coupled to one output of said differential amplifier, and that said two gallium arsenide field-effect transistors are wired as a common gate stage.

An output amplifier according to the present invention therefore comprises a first differential bipolar transistor amplifier stage receiving internal or complementary input pulse signals and a second amplifier stage being directly or indirectly controlled by the output of said first bipolar amplifier stage and comprising two gallium arsenide field-effect transistors (GaAs FETs) which are coupled to the outputs of said differential amplifier, respectively, and which are wired as a common gate stage. The characteristics of GaAs FETs as such are mentioned in "Improvement of the Drain Breakdown Voltage of GaAs Power MESFET's by a Simple Recess Structure", IEEE Transactions on Electron Devices, Vol. ED-25, No. 6, June 1978.

Although an output amplifier comprising only GaAs FETs has a very small gain, its characteristics allow output amplitudes of approximately 15V. As the parasitic capacitances of the GaAs FET devices are rather small, the GaAs FET stage can further generate pulses with very small transition times.

A power MOSFET as proposed by U.S. Pat. No. 4,528,520, above, cannot be used for a fast pulse generator as it is not operative at the required very high frequencies (e.g., its transition frequency is considerably smaller than the transition frequency of a GaAs FET). Further, the single-path design of this CRT amplifier is not suited for very high frequencies. This invention therefore proposes a "differential design", i.e. the bipolar amplifier stage is a differential amplifier followed by two GaAs FETs in the second stage. In such a design, the sum of the HF current remains approximately constant so that no spikes occur. The inputs receive two internal pulse signals complementary to each other from some external source. The differential amplifier is used for linear amplification (as the GaAs stage has only a low gain); it may further comprise one or more feedback loops, e.g. feedback resistors, for the purpose of linearization. It also compensates for the GaAs anomalies, in particular the droop effect.

It is further an important contribution of the present invention that the two GaAs FETs cascaded to the bipolar stage are wired as a common gate stage. This allows a further increase of the transition times at high amplitudes, in particular, as the gate currents compensate each other, i.e. there is no compensation current.

Thus, the combination of a first differential bipolar transistor amplifier stage with a second GaAs FET amplifier stage comprising two GaAs FETs wired as a common gate stage provides an output amplifier which may generate or amplify pulses with fast transition times and high output swings (high output amplitudes) as cannot be obtained by the prior art.

In a preferred embodiment, said first bipolar amplifier stage comprises a voltage-to-current converter for the purpose of impedance matching (the input of this portion of the first amplifier stage is a high-impedance input, whereas it has a low-impedance output). Preferably, said voltage-to-current converter is a bipolar transistor wired as an emitter follower. In contrast thereto, the second (GaAs FET) amplifier stage may be wired as a current-to-voltage converter.

In a further preferred embodiment of the invention, said first bipolar amplifier stage is connected with said second (GaAs FET) amplifier stage via a multiplier stage, preferably with adjustable multiplication factor. Such a multiplier portion may be used to adjust the amplitude of the output pulses.

In another preferred embodiment, said first and second amplifier stages are chips which are mounted on a common hybrid, e.g. in thick or thin film technology. It is not possible to integrate both bipolar and gallium arsenide technology on a single chip; on the other hand, the leads between the chips should be as short as possible to avoid additional delays caused by the lead capacitance together with the input impedance of the following portions (lead capacitance and input impedance operate as low-pass circuits). Therefore, it is the most feasible solution to mount both chips on a common hybrid.

In the accompanying drawings, a preferred embodiment of the present invention is shown. More features and advantages of the invention may be recognized from the following description in which these drawings are explained.

BRIEF DESCRIPTION OF THE DRAWINGS

FIGS. 1 and 2 are used to explain the concept of a combined bipolar/GaAs FET amplifier; the invention is depicted and explained with reference to FIG. 3.

Figure 1:
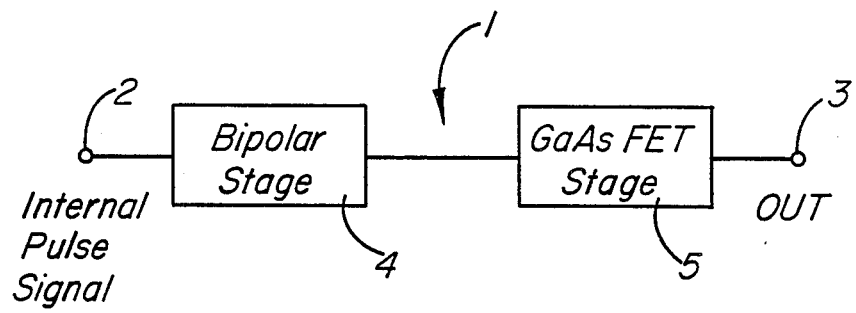
FIG. 1 is a block diagram of an output amplifier embodying the principles of this invention.

In the block diagram shown in FIG. 1, an output amplifier for a pulse generator is outlined in general as 1. An input signal such as an internal pulse signal is fed to the amplifier at input terminal 2; the output signal OUT is generated at output terminal 3.

The output amplifier consists of two cascaded stages or portions, a (first) bipolar stage 4 and a (second) GaAs Fet stage 5. The second stage 5 provides signals with fast transition times and, at the same time, high output swing, whereas first (bipolar) stage 4 provides a high gain and compensates for the GaAs FET anomalies (e.g. droop effect or temperature drift).

Figure 2:
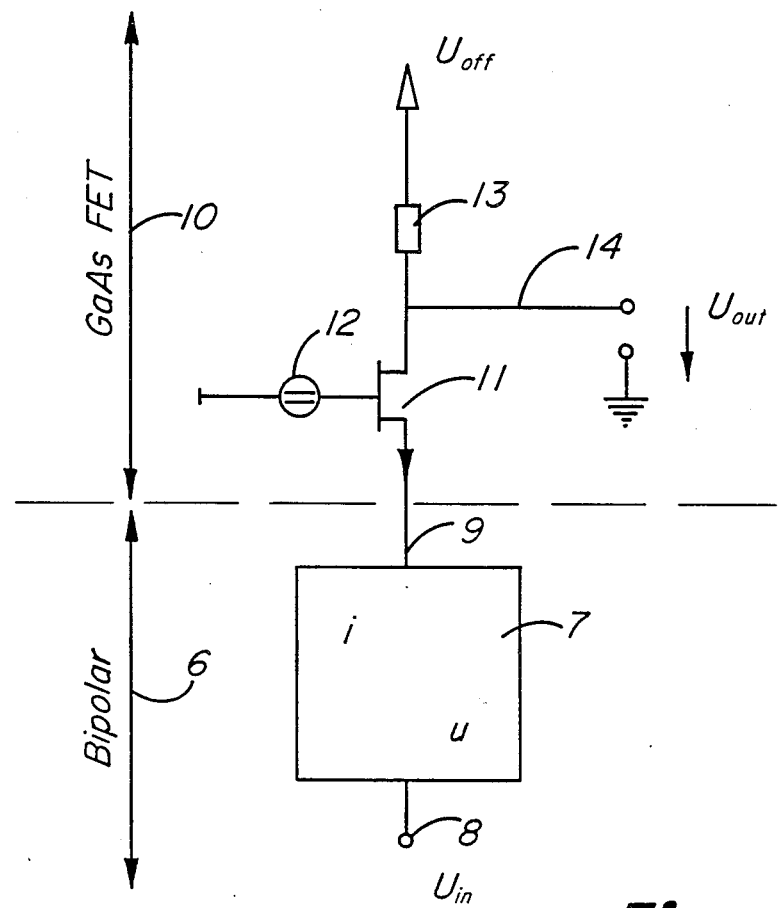
FIG. 2 depicts a simplified output amplifier circuit according to this invention.

FIG. 2 depicts a simplified schematic diagram of the output amplifier. The bipolar stage 6 comprises a voltage-to-current converter 7 receiving an internal pulse signal $U_{in}$ at input terminal 8. Voltage-to-current converter 7 provides impedance matching and amplification. Its output is fed via line 9 to the GaAs FET stage 10. The GaAs FET stage comprises a gallium arsenide field-effect transistor 11 which is wired as a common gate transistor. Its gate is connected with a D.C. voltage source 12. A further (adjustable) D.C. voltage $U_{off}$ is fed via resistor 13 to its drain. D.C. voltage $U_{off}$ is used to adjust the offset of the generated output signal $U_{out}$ (on line 14).

Preferably, bipolar stage 6 and GaAs FET stage 10 are both chips which are mounted on a common hybrid.

Resistor 13 is a 50 Ohm resistor. If the output (line 14) is also terminated with a 50 Ohm resistor, the output signal provided by the output amplifier is $5V_{pp}$ (Volts peak-to-peak), whereas, when the output is left open, the amplitude of the output signal is 10V.

Figure 3:
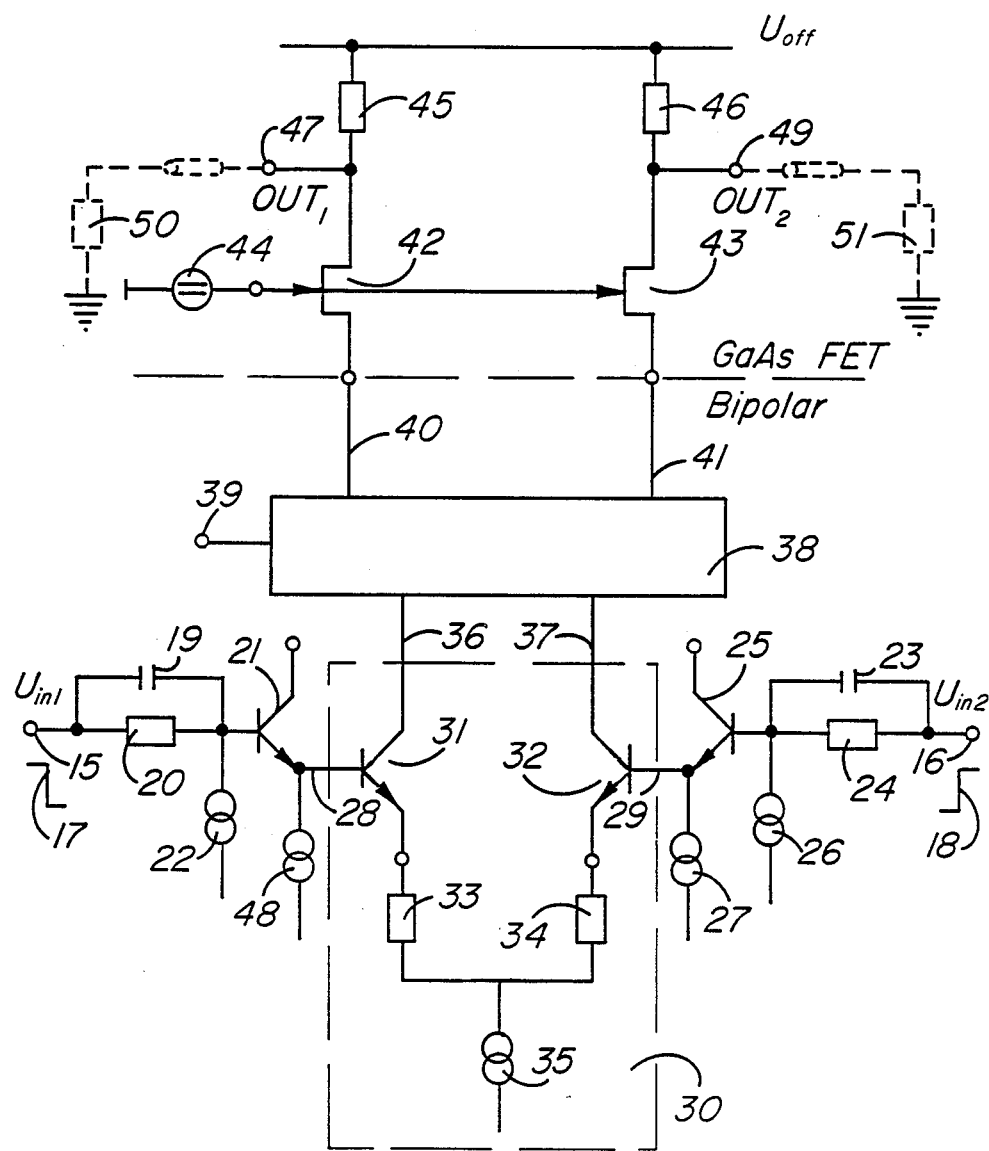
FIG. 3 is a detailed diagram of the output amplifier with differential inputs.

FIG. 3 depicts a detailed circuit diagram of an output amplifier with differential inputs. The first (bipolar) amplifier stage receives two internal pulse signals $U_{in1}$ and $U_{in2}$ at input terminals 15 and 16. These signals are complementary to each other as indicated by 17 and 18.

Capacitor 19 is used to bypass resistor 20 with respect to alternating current signals. Therefore, resistor 20 causes a level shift of the direct current component of the incoming signal $U_{in1}$, whereas the alternating current component is bypassed via capacitor 19.

Incoming signal $U_{in1}$ is then fed to the base of NPN transistor 21, said base also being connected with constant current source 22. The emitter of transistor 21 is further connected to constant current source 48. Transistor 21 is wired as an emitter follower and operates as an impedance matching circuit. It has a high-impedance input and a low-impedance output.

Capacitor 23, resistor 24, NPN transistor 25 and constant current sources 26 and 27 operate in the same manner.

The emitters of transistors 21 and 25 are connected via lines 28 and 29 to the inputs of a differential amplifier which is outlined in general as 30. This differential amplifier consists of two transistors 31 and 32, two resistors 33 and 34 and a constant current source 35. Resistors 33 and 34 are 10 Ohm resistors. Differential amplifier 30 is used for linear amplification of the difference between $U_{in1}$ and $U_{in2}$; the feedback resistors are further used for linearization, in particular with respect to the GaAs FET anomalies.

The outputs of differential amplifier 30 (lines 36 and 37) are fed to multiplier stage 38. This multiplier stage may be designed using any common technology, whereby the multiplication factor is adjustable to vary the output amplitude. A signal fed to input terminal 39 provides this multiplication factor.

The outputs of multiplier stage 38 are fed via lines 40 and 41 to an amplifier output stage comprising two gallium arsenide field-effect transistors 42 and 43 having common gates. The gates of these GaAs FET transistors are connected with a constant voltage source 44. Their drains are connected via resistors 45 and 46 (both 50 Ohm resistors) with a variable voltage $U_{off}$ which may be varied to adjust the signal offset.

Output signals $OUT_1$ and $OUT_2$ —which are complementary to each other —are present at terminals 47 and 49 which are connected to the respective drain terminals of GaAs FET transistors 42 and 43. These GaAs FET transistors operate as current-to-voltage converters with an amplification over a very broad frequency band.

If—as indicated by 50 Ohm resistors 50 and 51 —output is terminated with a load of 50 Ohms, the output voltage $OUT_1$ is —assuming a transistor current (of GaAs FET 42) of 200 mA —5 Volts as resistors 45 and 50 represent a parallel circuit with respect to the high frequency components. The same applies to output voltage $OUT_2$ (resistors 46 and 51). If, on the other hand, the outputs are left open, the output voltage ($OUT_1$ to $OUT_2$, respectively) is 10 Volts; this output voltage must be provided by GaAs FET transistor 42 (or 43).

What is claimed is:

1. An output amplifier for high output swing in pulse generators, comprising a first bipolar transistor linear amplifier stage receiving an internal pulse signal, and a second amplifier stage which is controller by the output of said first amplifier stage and comprises at least one field-effect transistor, in which:

said first bipolar transistor linear amplifier stage comprises a high gain differential amplifier with differential inputs and differential outputs;

said second amplifier stage comprises two gallium arsenide field-effect transistors for providing high output voltage swing;

said two gallium arsenide field-effect transistors are wired as a common gate;

means for applying a constant voltage to said common gate, and a multiplier stage having an adjustable multiplication factor, provided by an adjustable input connection, connecting said first amplifier stage to said second amplifier stage.

2. An output amplifier for high output swing in pulse generators, comprising a first bipolar transistor linear amplifier stage receiving an internal pulse signal, and a second amplifier stage which is controlled by the output of said first amplifier stage and comprises of least one field-effect transistor, in which:

said bipolar transistor linear amplifier stage comprises a high gain differential amplifier with differential inputs and differential outputs;

said second amplifier stage comprises two gallium arsenide field-effect transistors for providing high output voltage swing, each of these gallium arsenide transistors being coupled to an output of said differential amplifier;

said two gallium arsenide field-effect transistors are wired as a common gate;

means for applying a constant voltage to said common gate;

said first amplifier stage comprises an emitter follower, voltage-to-currentconvertor, and said first and second amplifier stages are chips mounted on a common hybrid of thick or thin film fabrication.

3. An output amplifier, comprising:

a. a first stage high gain amplifier including a pair of differentially connected emitter follower transistors having respective input circuits and respective output circuits;

b. means for connecting complementary input signals, respectively, to said respective input circuits;

c. a second stage amplifier for providing high output voltage swing including a pair of gallium arsenide field-effect transistors having respective input circuits, constant voltage energized common gate circuits, and respective output circuit; and d. circuit means comprising an adjustable multiplier connecting said respective output circuits of said differentially connected emitter follower transistors to said respective input circuits of said pair of gallium arsenide field-effect transistors.

4. A two stage amplifier, comprising:

a voltage-to-current converter input stage including a high gain differential bipolar transistor amplifier having high impedance differential input circuits and low impedance differential output circuits;

means for applying complementary variable voltages to said differential input circuits;

a current-to-voltage output stage including two gallium arsenide field-effect transistors having a common gate circuit, each gallium arsenide field-effect transistor having an input circuit and an output circuit;

means for applying a constant voltage to said common gate circuit;

means for coupling the input circuit of each gallium arsenide field-effect transistor to a respective one of said differential output circuits of said input stage, and means for applying a common voltage power supply to each output circuit of said gallium arsenide field-effect transistor.

5. The amplifier according to claim 4 in which:

said means for coupling comprises a multiplier circuit.

6. The amplifier according to claim 4 in which:

adjustment of said common voltage power supply adjusts the offset of an output voltage in each said output circuit.

* * * * *